(12) United States Patent
Lee et al.

(10) Patent No.: US 10,600,453 B2
(45) Date of Patent: Mar. 24, 2020

(54) MEMORY DEVICE

(71) Applicant: Samsung Electronics Co., Ltd., Suwon-si, Gyeonggi-do (KR)

(72) Inventors: Han Jun Lee, Gunpo-si (KR); Dong Hun Kwak, Hwaseong-si (KR); Yo Han Lee, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/130,034

(22) Filed: Sep. 13, 2018

(65) Prior Publication Data

US 2019/0259430 A1     Aug. 22, 2019

(30) Foreign Application Priority Data

Feb. 19, 2018  (KR) .......................... 10-2018-0019276

(51) Int. Cl.
| | |
|---|---|
| *G11C 7/00* | (2006.01) |
| *G11C 7/10* | (2006.01) |
| *G11C 7/18* | (2006.01) |
| *H01L 27/11524* | (2017.01) |
| *G11C 16/28* | (2006.01) |
| *G11C 16/04* | (2006.01) |
| *G11C 7/12* | (2006.01) |
| *G11C 11/56* | (2006.01) |
| *G11C 29/02* | (2006.01) |

(52) U.S. Cl.
CPC .............. *G11C 7/1048* (2013.01); *G11C 7/12* (2013.01); *G11C 7/18* (2013.01); *G11C 11/5642* (2013.01); *G11C 16/0483* (2013.01); *G11C 16/28* (2013.01); *G11C 29/021* (2013.01); *G11C 29/028* (2013.01); *H01L 27/11524* (2013.01)

(58) Field of Classification Search
CPC ...... G11C 16/26; G11C 16/0483; G11C 16/32; G11C 16/24; G11C 16/10; G11C 16/08; G11C 7/1084; G11C 7/12; G11C 11/5671; G11C 16/34; G11C 16/3459; G11C 7/1024; G11C 7/1045
USPC ............ 365/185.09, 185.18, 185.25, 185.29, 365/185.05, 185.11, 185.17, 189.011, 365/191, 203, 230.01, 230.06, 233.1
See application file for complete search history.

(56) References Cited

U.S. PATENT DOCUMENTS

| | | |
|---|---|---|
| 8,767,481 B2 | 7/2014 | Cho et al. |
| 8,879,329 B2 | 11/2014 | Moschiano et al. |
| 8,908,430 B2 | 12/2014 | Yoo |
| 9,396,796 B2 | 7/2016 | Lee et al. |
| 9,685,206 B2 | 6/2017 | Choi et al. |
| 2010/0202216 A1* | 8/2010 | Byeon ................ G11C 16/0483 365/185.25 |
| 2015/0378887 A1 | 12/2015 | Lee et al. |
| 2017/0123724 A1 | 5/2017 | Park et al. |
| 2017/0162273 A1 | 6/2017 | You et al. |

(Continued)

*Primary Examiner* — Thong Q Le
(74) *Attorney, Agent, or Firm* — Harness, Dickey & Pierce, P.L.C.

(57) ABSTRACT

A memory device includes a memory cell array including a plurality of memory cells, a page buffer unit including the plurality of memory cells, and a driving determination unit determining whether to perform at least one of a pre-charging operation, a development operation and a latching operation of page buffers connected to the memory cells provided with the read voltage.

19 Claims, 15 Drawing Sheets

(56) References Cited

U.S. PATENT DOCUMENTS

2017/0206124 A1 7/2017 Lim et al.
2017/0221585 A1 8/2017 Lee

* cited by examiner

MEMORY DEVICE

CROSS-REFERENCE TO RELATED APPLICATION(S)

This application claims benefit of priority to Korean Patent Application No. 10-2018-0019276 filed on Feb. 19, 2018 in the Korean Intellectual Property Office, the disclosure of which is incorporated herein by reference in its entirety.

BACKGROUND

1. Field

Example embodiments of the present inventive concepts relates to a memory device and/or a data processing method.

2. Description of Related Art

A semiconductor memory device may be classified as a volatile semiconductor memory device or a non-volatile semiconductor memory device. A volatile semiconductor memory device may have drawbacks, in that the speed of reading and writing is fast, but stored contents may disappear when the power supply thereto is cut off. On the other hand, a nonvolatile semiconductor memory device may preserve its contents, even if the power supply thereto is cut off. Therefore, such a nonvolatile semiconductor memory device is used to store contents required to be preserved, regardless of whether power is supplied thereto or not.

A representative example of a non-volatile memory device is a flash memory device. Such a flash memory device is widely used as a storage medium for audio and video data in information technology devices, such as computers, mobile phones, smartphones, personal digital assistants PDAs, digital cameras, camcorders, voice recorders, MP3 players, handheld PCs, game machines, fax machines and scanners. Recently, high capacity, high-speed input/output and low power consumption technologies have been actively researched in order to reduce a load on mobile devices such as smartphones.

SUMMARY

In one or more example embodiments of the present inventive concepts, a nonvolatile memory device and/or a data processing method may perform data processing operation that may significantly reduce an occurrence of error bits in the device.

Example embodiments of the present inventive concepts provide a memory device in which, in synchronization with sampling operations of data stored in portions of page buffers, remaining page buffers are non-actuated.

According to an example embodiment of the present inventive concepts, a memory device includes a memory cell array including a plurality of memory cells; a plurality of page buffers configured to store data associated with memory cells of the plurality of memory cells that are provided with a read voltage; and processing circuitry configured to determine whether to perform at least one of a pre-charging operation, a development operation, and a latching operation of page buffers connected to the memory cells provided with the read voltage.

According to an example embodiment of the present inventive concepts, a memory device includes a plurality of page buffers configured to store data associated with memory cells among a plurality of memory cells provided with a read voltage, and output the data stored in the plurality of page buffers; and processing circuitry configured to, count at least one of on-cells and off-cells of the memory cells based on the data output from ones of the plurality of page buffers, determine which of the plurality of page buffers are selected page buffers, and drive the selected page buffers.

According to an example embodiment of the present inventive concepts, a memory device includes a memory cell array including a plurality of memory cells; and a plurality of pages buffers configured to store data associated with memory cells among the plurality of memory cells provided with a read voltage, and to sample the data stored in selected page buffers among the plurality of page buffers such that non-selected page buffers among the plurality of page buffers are non-actuated in synchronization with sampling of the data.

BRIEF DESCRIPTION OF DRAWINGS

The above and other aspects, features, and advantages of the example embodiments will be more clearly understood from the following detailed description, taken in conjunction with the accompanying drawings, in which:

FIGS. 13 to 16 are diagrams illustrating the example of selected page buffers according to an example embodiment of the present inventive concepts;

DETAILED DESCRIPTION

Hereinafter, example embodiments of the present inventive concepts will be described with reference to the accompanying drawings.

Figure 1:
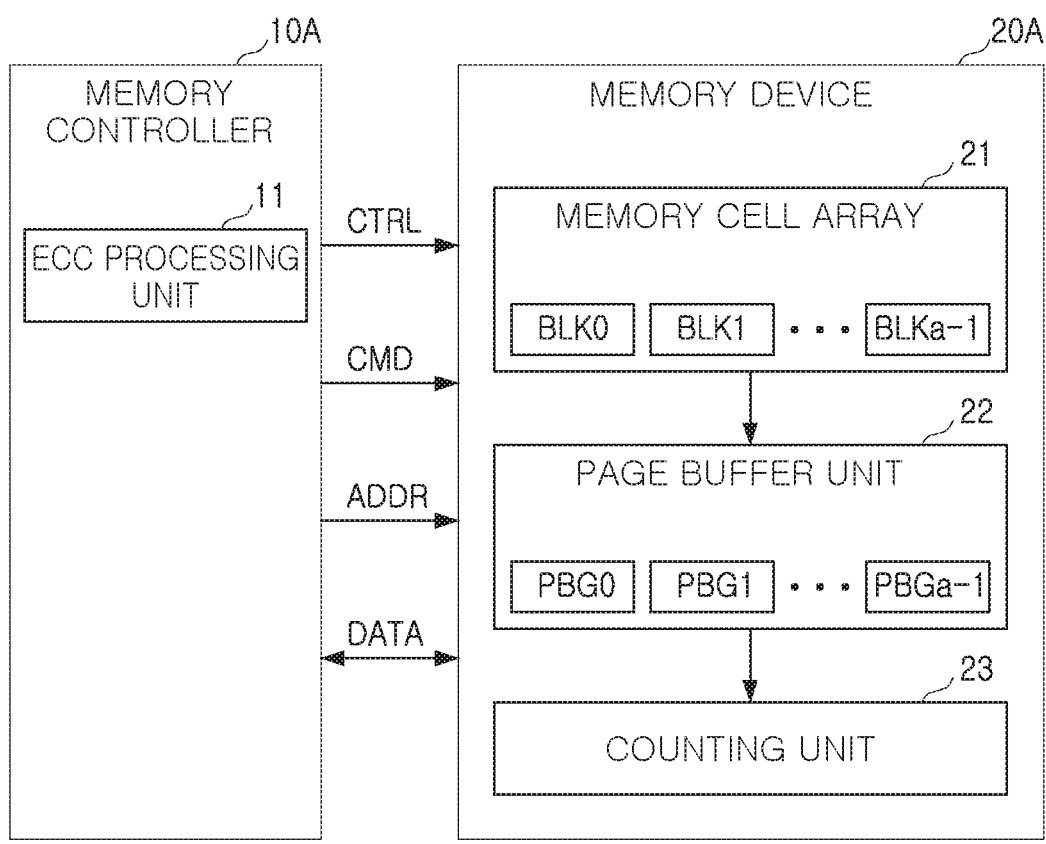
FIG. 1 is a block diagram schematically illustrating a memory system according to an example embodiment of the present inventive concepts.

FIG. 1 is a block diagram schematically illustrating a memory system according to an example embodiment.

Referring to FIG. 1, a memory system 1 may include a memory controller 10A and a memory device 20A. The memory device 20A may include a memory cell array 21, a page buffer unit 22 and a counting unit 23.

The memory controller 10A may include an error correction circuit (ECC) processing unit 11. The memory controller 10A controls the memory device 20A. The memory controller 10A may control a program regarding the memory device 20A, reading and erase operations, by providing an address ADDR, a command CMD and a control signal CTRL to the memory device 20A.

The memory cell array 21 may include a plurality of memory blocks BLK0 to BLKa-1, where a is an integer of 2 or more, and each of the memory blocks BLK0 to BLKa-1 may include a plurality of pages. Each of the memory blocks BLK0 to BLKa-1 may include a plurality of memory cells arranged in regions in which a plurality of word lines and a plurality of bit lines intersect. In an example embodiment, the plurality of memory cells may be flash memory cells and the memory cell array 21 may be a NAND flash memory cell array or a NOR flash memory cell array. Hereinafter, the example embodiments of the present inventive concepts are described taking a case in which the plurality of memory cells are flash memory cells as an example. However, example embodiments are not limited thereto. According to example embodiments, the plurality of memory cells may be resistive memory cells such as a resistive random access memory (RRAM), a phase change RAM (PRAM) or a magnetic RAM (MRAM).

The page buffer unit 22 may store data to be recorded in the memory cell array 21 or data read from the memory cell array 21. In the example embodiment, the page buffer unit 22 includes a plurality of page buffer groups PBG0 to PBGa-1, and the plurality of page buffer groups PBG0 to PBGa-1 may include a plurality of page buffers. The number of page buffer groups PBG0 to PBGa-1 may correspond to the number of the memory blocks BLK0 to BLKa-1, and the number of the plurality of page buffers included in each of the plurality of page buffer groups PBG0 to PBGa-1 may correspond to the number of the plurality of bit lines included in each of the memory blocks BLK0 to BLKa-1.

For example, when a read operation with respect to the memory device 20A is performed, the plurality of page buffers may store data of memory cells selected from the plurality of memory cells included in the memory cell array 21. As an example, each of the plurality of page buffers includes at least one latch, and a latch signal is transmitted to at least one latch to latch data regarding the memory cells.

For example, when the read operation on the memory device 20A is performed, the plurality of page buffers may read and store the data regarding the selected memory cells by a read voltage. In addition, in a manner different therefrom, the plurality of page buffers may read and store data regarding the selected memory cells by read voltages having different levels, and perform logical operations on the stored data respectively. In this case, the plurality of page buffers may respectively perform an exclusive logical sum (XOR) on two pieces of data that are respectively read from two adjacent voltage levels among different voltage levels.

The memory device 20A may include processing circuitry (not shown). The processing circuitry may be, but not limited to, a processor, Central Processing Unit (CPU), a controller, an arithmetic logic unit (ALU), a digital signal processor, a microcomputer, a field programmable gate array (FPGA), an Application Specific Integrated Circuit (ASIC), a System-on-Chip (SoC), a programmable logic unit, a microprocessor, or any other device capable of performing operations in a defined manner.

The processing circuitry may be configured, through a layout design or execution of computer readable instructions stored in a memory (not shown), as a special purpose computer to implement a counting unit 23 to count the number of memory cells from the data stored in the plurality of page buffers, and an ECC processing unit 11 to determine whether there is an error in the data read from the memory device 20A and correct any errors.

As an example, when a read voltage is provided, the counting unit 23 may count off-cells or on-cells of the memory cells from the data stored in each of the page buffers. In addition, in another example, when a plurality of read voltages having different levels are provided, the counting unit 23 may count the number of on-cells of memory cells existing in each of a plurality of intervals separated by the different voltage levels, from the data of the logical operation stored in each of the page buffers.

The counting unit 23 may count fail bits of the data stored in the page buffer unit 22 from the calculated data, during the read operation of the memory cells. The counting unit 23 may count fail bits, calculate the fail bits and provide the calculated fail bit value to the memory controller 10A.

According to an example embodiment, the counting unit 23 may count fail bits, from the data read by a dummy voltage provided to the memory cells at the time of a pass/fail discrimination operation. For example, the counting unit 23, when the memory cells perform an read operation, may count not only the data calculated from the provided read voltage but also fail bits from the data calculated from the provided dummy voltage during the separate pass/fail discrimination operation. In this case, the dummy voltage may have a different voltage level from that of the read voltage, the dummy voltage may be configured to have one voltage level or to have a plurality of different voltage levels, similar to the number of the read voltages. Hereinafter, for convenience of explanation, assumed case in which that the counting unit 23 calculates the fail bit value from the calculated data at the time of the read operation of the memory cells is taken as an example. However, the counting unit 23 according to an example embodiment of the present inventive concepts may calculate the fail bit from the calculated data by the provided dummy voltage, at the time of the separate pass/fail discrimination operation.

The ECC processing unit 11 may determine whether there is an error in the data read from the memory device 20A and correct any errors. The ECC processing unit 11 may detect an error bit of the data read from the memory device 20A by comparing the generated parity when reading and the stored parity at the time of programming the data, and correct the detected the error bit.

Figure 2:
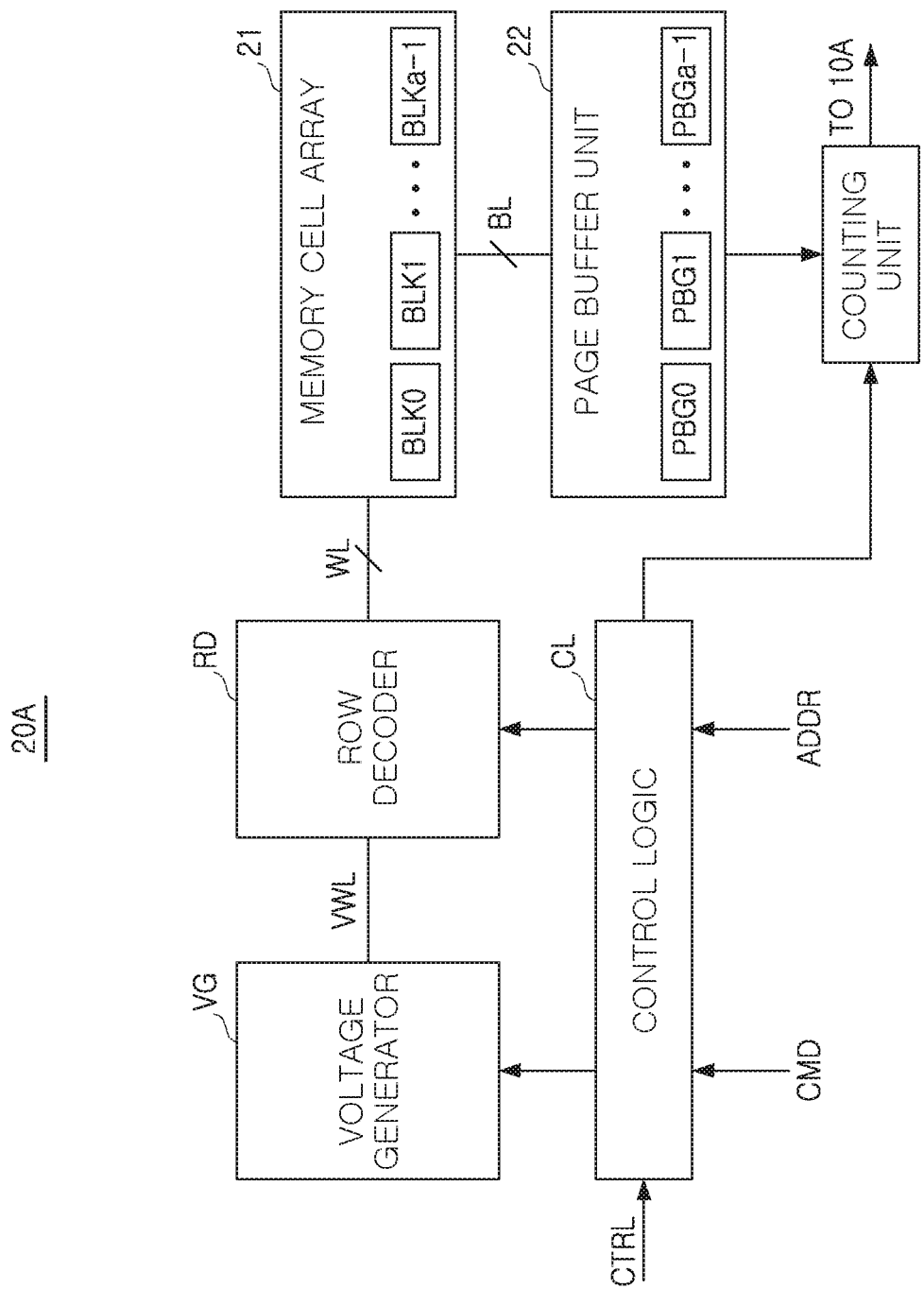
FIG. 2 is a detailed block diagram illustrating a memory device included in the memory system of FIG. 1.

FIG. 2 is a detailed block diagram illustrating the memory device included in the memory system of FIG. 1.

Referring to FIG. 2, the memory device 20A may include the memory cell array 21, the page buffer unit 22, the counting unit 23, a control logic CL, a voltage generator VG and a row decoder RD.

As discussed above, the memory device 20A may include processing circuitry. The processing circuitry may be configured, through a layout design or execution of computer readable instructions stored in a memory (not shown), as a special purpose computer to implement the counting unit 23 and control logic CL.

The control logic CL may write data to the memory cell array 21 or output the various control signals for reading data from the memory cell array 21 according to a command CMD, an address ADDR and a control signal CTRL, received from the controller 10A. The control logic may write data to the memory cell array 21 or output the various control signals for reading data. The various control signals from the control logic CL may be transmitted to the voltage generator VG, the row decoder RD, the page buffer unit 22 and the counting unit 23.

The voltage generator VG may generate the driving voltage VWL for driving a plurality of word lines WL based on the control signals received from the control logic CL. The driving voltage VWL may be a program voltage, read voltage or pass voltage. The row decoder RD may activate some word lines of a plurality of word lines WL based on row address. During the read operation, the row decoder RD may apply the read voltage to the selected word lines, and apply the pass voltage to the unselected word lines. Meanwhile, during the writing operation, the row decoder RD may apply the program voltage to the selected word lines, and apply the pass voltage to the unselected word lines. A plurality of page buffers included in the page buffer unit 22 may respectively be connected to the memory cell arrays 21 through the plurality of bit lines BL. During the read operation, a plurality of page buffers may output the stored data in the memory cell array 21 operating by a sense amplifier. Meanwhile, during the writing operation, a plurality of page buffers may input data to be stored in the memory cell array 21 as operating by a writing driver. A plurality of page buffers may be respectively connected to data input/output circuit through a plurality of data lines.

The counting unit 23 may count the number of the memory cells from the data stored in a plurality of page buffers. As described above, if one read voltage is provided, off cells or on cells of the memory cells may be counted, if a plurality of read voltage having different levels are provided, the number of the memory cells existing in the each of the plurality of the sections divided by the different voltage level may be counted. In addition, the counting unit 23 may calculate fail bit value, provide the calculated fail bit value to the control logic CL.

The control logic CL may determine whether the program passes or fails according to the fail bit value provided from the counting unit 23. According to an example embodiment, if the fail value is below a desired (or, alternatively, the preset) threshold value, the memory device 20A may determine skipping the verification operation to be performed after the program voltage is additionally applied, terminating the program operation, or executing the program regarding the status of the next program.

Figure 3:
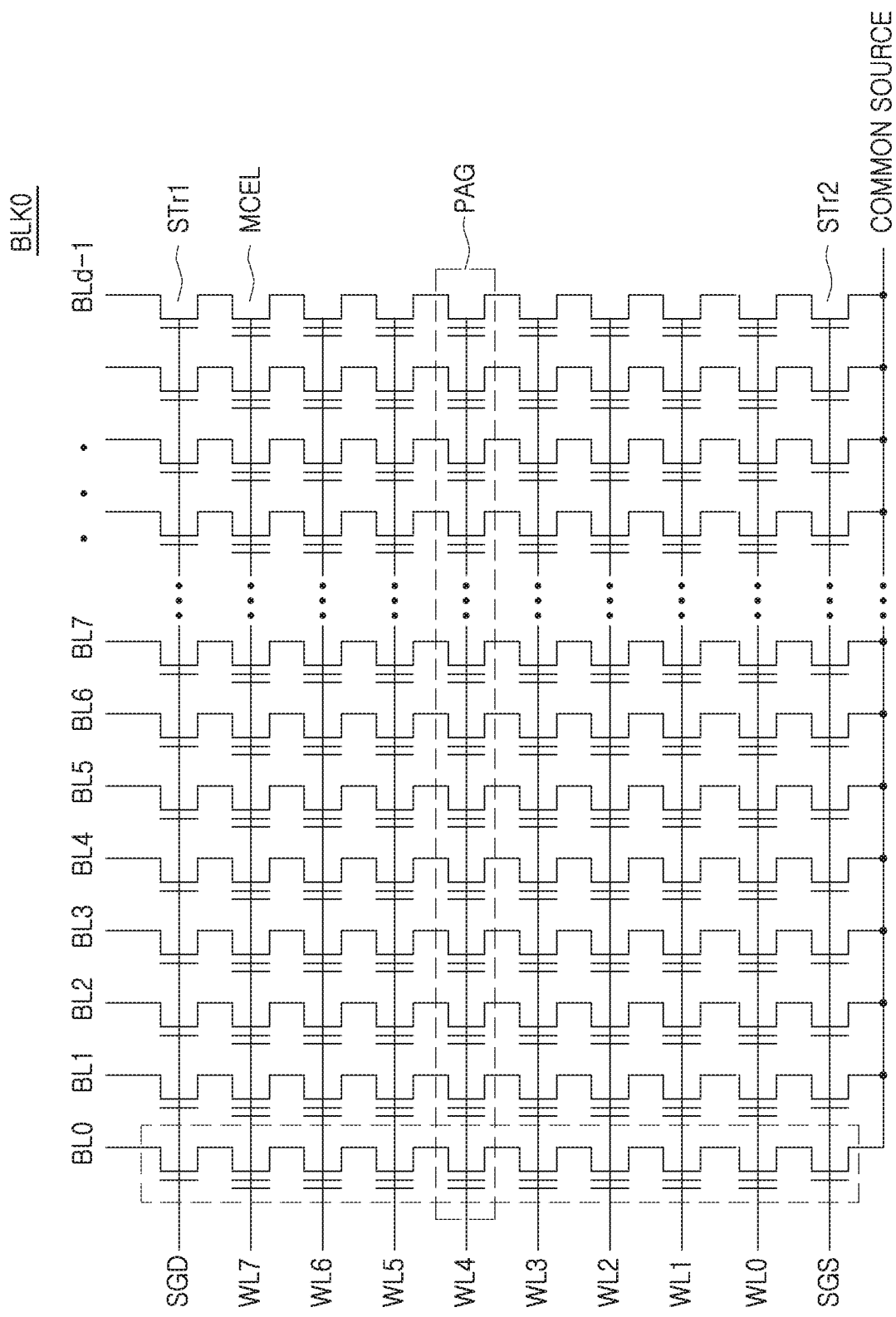
FIG. 3 is a circuit diagram illustrating an example of a memory block included in a memory cell array of FIG. 1 and FIG. 2.

FIG. 3 is a circuit diagram illustrating an example of the memory blocks included in the memory cell array of FIG. 2. In FIG. 3, for convenience of illustration, only the structure of the block BLK0 is illustrated; however, the other blocks BLK1 to BLK$a$-1 may have a same configuration as the block BLK0.

Referring to FIG. 3, the memory cell array 21 may be the memory cell array of a NAND flash memory. The block BLK0 may include d strings (where d is an integer of 2 or more) in which eight memory cells MCEL are connected in series, in the bit line BL0 to BL$d$-1 direction. Each string STR may include a drain selection transistor STr1 and a source selection transistor STr2, connected to both ends of the memory cells MCEL connected in series. The NAND flash memory device having the same configuration as FIG. 3 performs erasing on a block-by-block basis, and performs a program by the page basis PAG corresponding to the word lines WL0 to WL7. FIG. 3 illustrates, as an example, a case in which eight pages PAG for eight word lines WL0 to WL7 are provided in one block. However, the block BLK0 of the memory cell array 21 according to the example embodiments of the present inventive concepts may have a different number of memory cells and pages than the number of the memory cells MCEL and the page PAG shown in FIG. 3. However, the block BLK0 of the memory cell array 21 according to example embodiments of the present inventive concepts may have a different number of the memory cells MCEL and pages PAG illustrated in FIG. 3. In addition, the memory device 20 of FIGS. 1 and 2 may include a plurality of memory cell arrays performing the same operation with a same configuration as the memory cell array 21 as described above.

Figure 4:
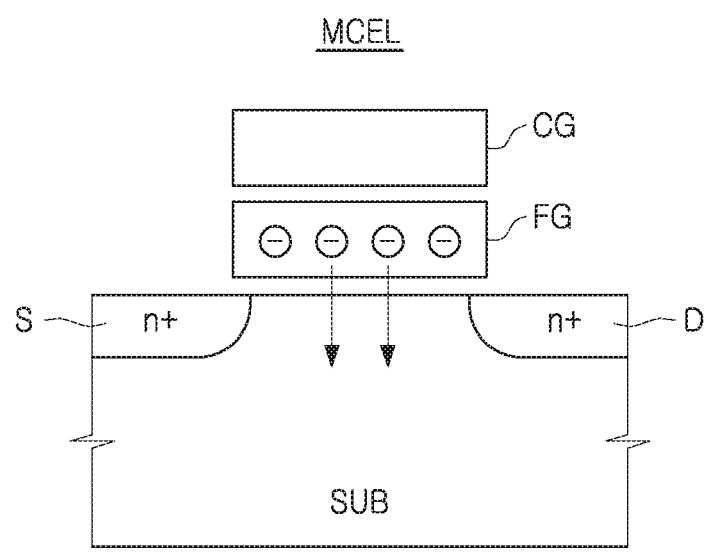
FIG. 4 is a cross-sectional diagram illustrating an example of a memory cell included in the memory block of FIG. 3.

FIG. 4 is a cross-sectional diagram illustrating an example of the memory cell included in the memory block of FIG. 3.

Referring to FIG. 4, a source S and a drain D are formed on the SUB, a channel area between the source S and the drain D. A floating gate FG is formed on the upper part of the channel area, and an insulating layer such as a tunneling insulating layer may be arranged between the channel area and the floating gate FG. A control gate CG is formed on the upper part of the floating gate FG, the insulating layer such as blocking insulating layer is arranged between the floating gate FG and the control gate CG. The voltage needed for the program about the memory cell MCEL, the erase operation and read operation may be applied in the SUB, the source S and the control gate CG. The data stored in the memory cell MCEL may be read by the discrimination of the threshold voltage of the memory cell in the flash memory device. Then, the threshold voltage Vth of the memory cell is determined depending on the amount of the electrons stored in the floating gate FG. As more electrons are stored in the floating gate FG, the threshold voltage of the memory cell may be higher. The electrons stored in the floating gate FG of the memory cell MCEL may be leaked in the direction of the arrow for various reasons, and thus, the threshold voltage of the memory cell MCEL may be changed. For example, the electrons stored in the floating gate FG may be leaked by the abrasion of the memory cell. If the program of the memory cell MCEL is repeated, and access operations such as erasing and reading are carried out, the insulator film between the channel area and the floating gate FG may be worn out, and then the electrons stored in the floating gate FG may be leaked. As another example, the electrons stored in the floating gate FG may be leaked by the high temperature stress or the temperature differential at the time of programming or reading.

Figure 5:
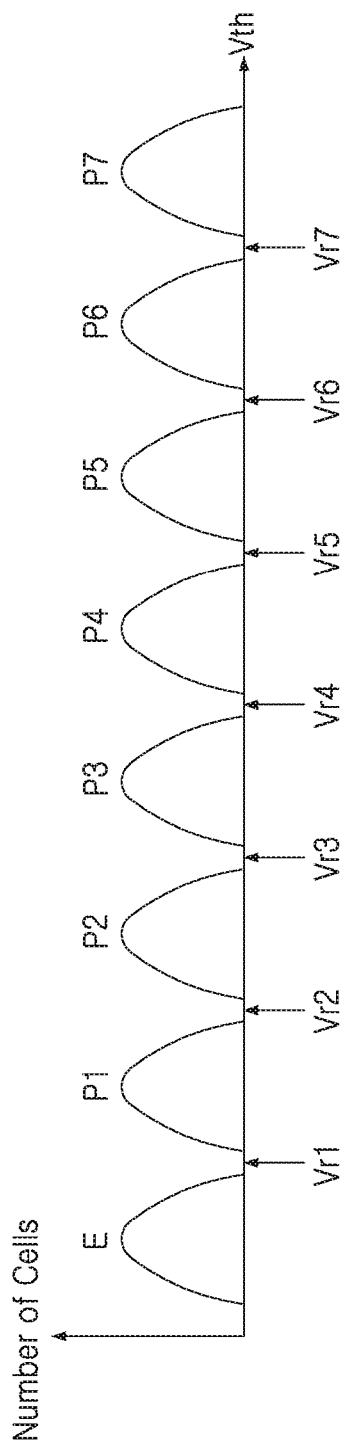
FIG. 5 is a graph indicating a voltage distribution based on a threshold voltage when a memory cell of FIG. 3 is multilevel cell.

FIG. 5 is a graph illustrating the distribution based on a threshold voltage, in case the memory cell MCEL of FIG. 3 is a triple level cell: TLC that can store 3 bits of data per cell. Hereinafter, while the operation will be described, taking the case in which the memory cell is the triple level cell TLC as an example, a method to be described later is a quadruple level cell QLC that can store 4 bits of data per cell and it is sure it may be applied to a multilevel cell that can store more than 4 bits of data.

Referring to FIG. 5, a horizontal axis represents the threshold voltage Vth and the vertical axis represents the number of the memory cells MCEL. The memory cell MCEL has one of the status, erase E, the first program P1, the second program P2, the third program P3, the fourth program P4, the fifth program P5, the sixth program P6 and the seventh program P7, in case that the memory cell MCEL is multilevel cell of 3 bits. In case of the multilevel cell, compared to the single level cell, since the interval among the distributions of the threshold voltage is relatively narrow, the read reliability may decrease in response to the small change of the threshold voltage Vth in the multilevel cell. The first read voltage Vr1 has a voltage level between the dispersion of the memory cell MCEL having the erase state E and the first program state P1. The second read voltage level Vr2 has a voltage level between the dispersion of the memory cell MCEL having the first program state P1 and the second program state P2. The third read voltage Vr3 has a voltage level between the dispersion of the memory cell MCEL having the second program state P2 and the third program state P3. The fourth read level Vr4 has a voltage level between the dispersion of the memory cell MCEL having the third program state P3 and the fourth program state P4. The fifth read level Vr5 has a voltage level between the dispersion of the memory cell MCEL having the fourth program state P4 and fifth program state P5. The sixth read voltage Vr6 has a voltage level between the dispersion of the memory cell MCEL having the fifth program state P5 and the sixth program state P6. The seventh read voltage Vr7 has a voltage level between the distribution of the memory cell MCEL having the sixth program state P6 and the seventh program state P7.

If the first read voltage Vr1 is applied to the control gate CG of the memory cell MCEL, the memory cell MCEL in the first program state P1 is turned off while the memory cell MCEL in the erase state E is turned on.

If the first read voltage is applied and the memory cell MCEL is turned on, a current flows through the memory cell MCEL, if the memory cell MCEL is turned off, no current flows through the memory cell MCEL. Accordingly, the data stored in the memory cell MCEL may be distinguished based on whether the memory cell MCEL is turned on. In this way, the assignment of the logical levels of data may be changed according to the example embodiments.

Figure 6:
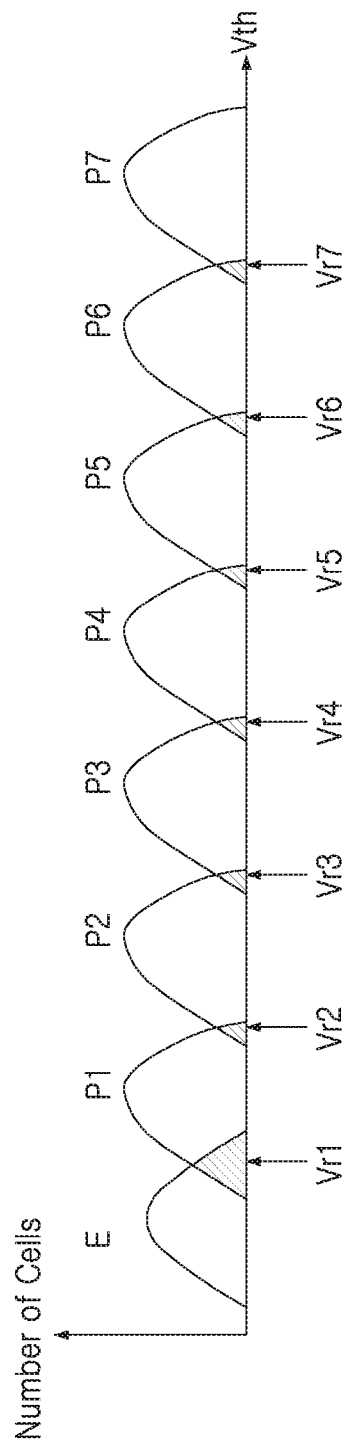
FIG. 6 is a graph indicating the case in which the threshold voltage of the memory cell in the graph of FIG. 5 is changed.

FIG. 6 is a graph illustrating a case in which the threshold voltage of the memory cell MCEL is changed in the graph of FIG. 5.

Referring to FIG. 6, the memory cells MCEL respectively programmed in the erase state E and the first to seventh program states P1 to P7 may have distribution changed by external stimuli and/or wear as illustrated in FIG. 6. In FIG. 6, the memory cells MCEL belonging to the hatched portion may cause a reading error, and then, the reliability of the memory device 20 may be deteriorated. For example, when the read operation to the memory device 20A is performed by using the first read voltage Vr1, it can be determined to be the erase state E by the decrease in the threshold voltage Vth, though the memory cells MCEL belonging to the hatched part are programmed in the first program state P1. That is, among the programmed memory cells in the first program state P1, the memory cells whose threshold voltage Vth is lower than the first read voltage Vr1 may be determined as fail bits for the first program state P1.

Figure 7:
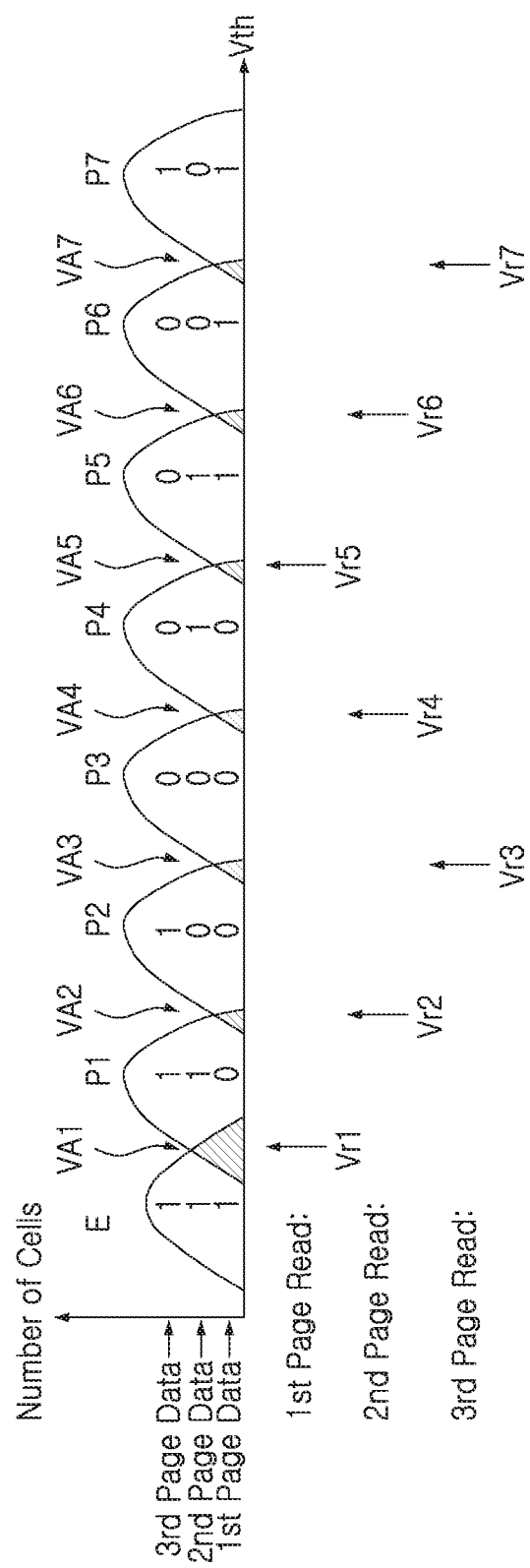
FIG. 7 is a graph indicating a read operation per page in case a memory cell is a 3-bit multilevel cell.

FIG. 7 is a graph illustrating the read operation per page in case that the memory cell is 3 bit multilevel cell. The page of the 3 bit multilevel cell may include a plurality of bit pages, the plurality of bit pages may include a least significant bit LSB page, a center significant bit CSB, and a most significant bit MSB page.

Referring to FIG. 7, in case that the memory cell MCEL is 3 bit multilevel cell, the read operation for the memory cell MCEL may be performed three times, and eight pieces of status information may be divided into three bit pages and output. In an example embodiment, the erase state E is allocated data '111,' the first program state P1 is allocated data '110,' the second program state P2 is allocated data '100,' the third program state P3 is allocated data '000,' the fourth program state P4 is allocated data '010,' the fifth program state P5 is allocated data '011,' the sixth program state P6 is allocated data '001' and the seventh program state P7 may be allocated data '101.' However, according to the example embodiments, data allocated to the status of each program may be changed. The first bit page read corresponding to the least significant bit LSB page includes the first valley VA1 between the erase state E and the first program state P1, and a read for the fifth valley VA5 between the fourth program state P4 and the fifth program state P5. The second bit page read corresponding to the center significant bit page includes the second valley VA2 between the first program state P1 and the second program state P2, the fourth valley VA4 between the third program P3 and the fourth program state P4, and the read for the sixth valley VA6 between the fifth program state P5 and the sixth program state P6. The third bit page read corresponding to the most significant bit page includes the third valley VA3 between the second program state P2 and the third program state P3, and the read for the seventh valley VA7 between the sixth program state P6 and the seventh program state P7.

In the stage of the first bit page read, when performing the read operation for the first valley VA1 and the fifth valley VA5, if it is an off-cell in the first valley VA1 and an on-cell in the fifth valley VA5, the first bit page data is '0.' If not, the first bit page data may be output as '1.' Next, in the stage of the second bit page read, when performing the read operation for the second valley VA2, the fourth valley VA4 and the sixth valley VA6, if it is 'an off-cell' in the second valley VA2 and an 'on-cell' in the fourth valley (VA4), the second bit page data is '0,' if it is an 'off-cell' in the sixth valley, the second bit page data is '0.' If not, the second bit page data may be output as '1.' Next, in the stage of the third bit page read, when performing the read operation for the third valley VA3 and the seventh valley VA7, if it is an 'off-cell' in the third valley VA3 and an 'on-cell' in the seventh valley VA7, the third but page data is '0.' If not, the third bit page data may be output as '1.'

Figure 8:
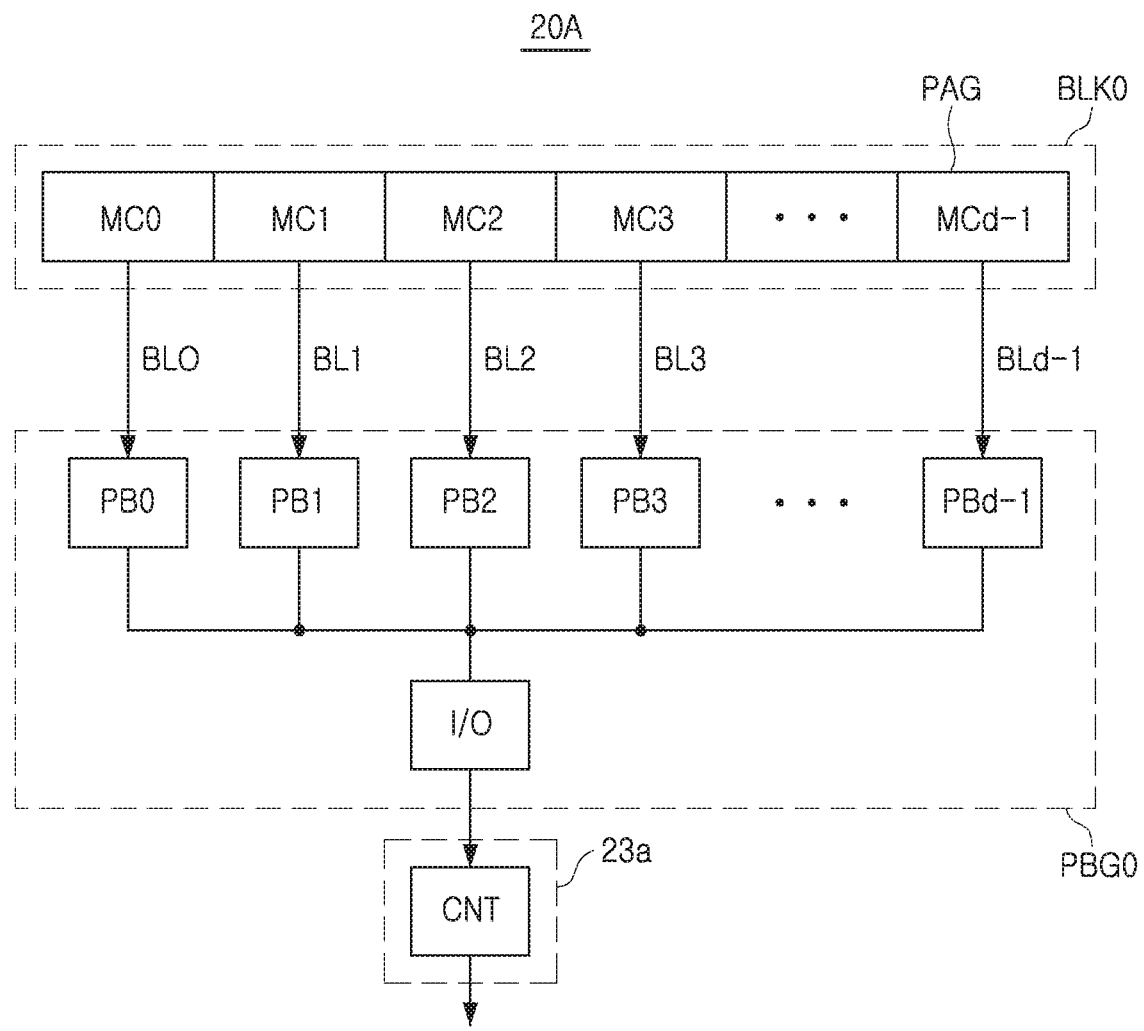
FIG. 8 is a detailed block diagram illustrating an example of the memory device included in the memory system of FIG. 1.

FIG. 8 is a detailed block diagram illustrating an example of the memory device 20A included in the memory system 1 of FIG. In FIG. 8, for the convenience of illustration, it merely illustrates connection relation between the memory block BLK0 and the page buffer group PBG0. However, the other memory blocks BLK1 to BLKa-1 and the page buffer group PBG1 to PBGa-1 may have a similar connection relation.

Referring to FIG. 8, the memory device 20A may include the memory block BLK0, the page buffer group PBG0 and the counting unit 23A The memory block BLK0 may include a page PAG, and the page PAG may include d memory cells MC0, MC1, MC2, MC3 . . . MCd-1. Although only one page PAG included in the memory block BLK0 is illustrated in FIG. 8, the memory block BLK0 may include a plurality of pages. The page buffer groups PBG0 may include a plurality of page buffers PB0, PB1, PB2, PB3, . . . , PBd-1, the plurality of page buffers PB0, PB1, PB2, PB3, . . . , PBd-1 respectively may be connected with the memory cells MC0, MC1, MC2, MC3, . . . , MCd-1 through the corresponding bit lines BL0, BL1, BL2, BL3, . . . , BLd-1. A plurality of page buffers PB0, PB1, PB2, PB3, . . . PBd-1 may store data read from the data to be recorded in the memory cell array 21 or the data read from the memory cell array 21. The data stored in the plurality of page buffers PB0, PB1, PB2, PB3, . . . PBd-1 may be provided to the counting unit 23A sequentially through the data out unit I/O.

Figure 9A:
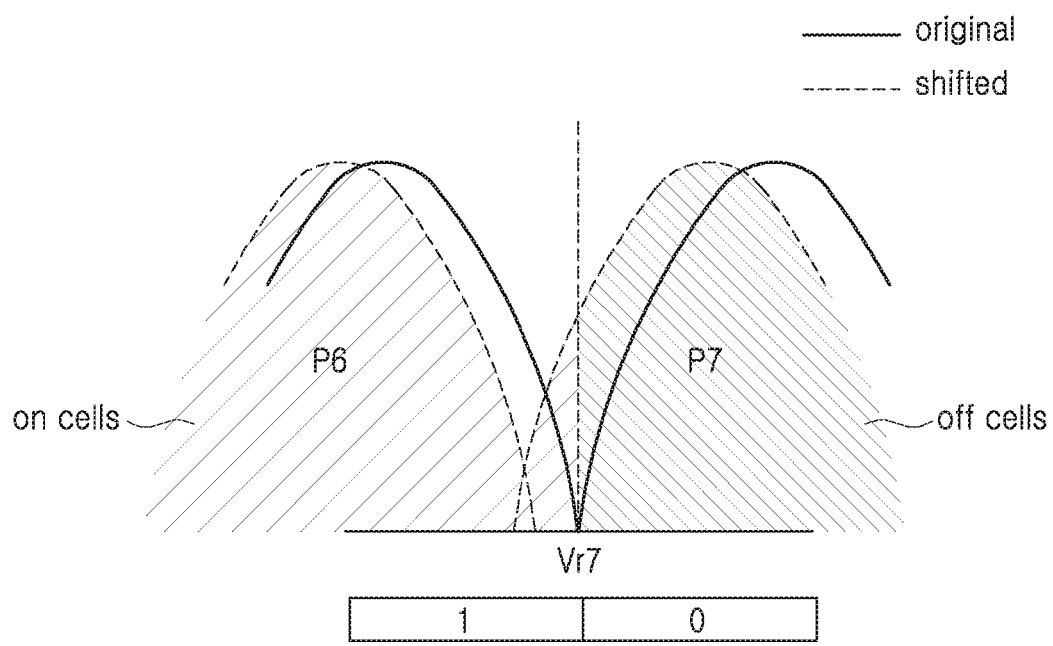
FIG. 9A is a diagram illustrating a read operation of memory cells according to an example embodiment of the present inventive concepts.

FIG. 9A is a diagram illustrating a read operation of the memory cells according to an example embodiment of the present inventive concepts.

Referring to FIG. 9A the read operation of the memory cells according to the example embodiment may be calculated by providing a read voltage to the word lines of the memory cells. The memory controller 10A reads data from the memory cell MCEL, by providing the two adjacent states of the memory cells MCEL, for example, the read voltage between the sixth program state P6 and the seventh program state P7 to the memory cell MCEL. Then, the memory cells whose threshold voltage is lower than the seventh read voltage Vr7 is read to '1,' the memory cells MCEL whose threshold voltage is higher than the seventh read voltage Vr7 is read to '0.' The read data is stored in the page buffer unit 22A, the data stored in the page buffer unit 22A may be counted in the counting unit 23A.

The counting unit 23A may count the number of the memory cells judged as an off-cell from the number of '0' among the data read by the seventh read voltage Vr7, and the number of memory cells judged as an on-cell from the number of '1' among the data read by the seventh read voltage Vr7.

On the other hand, when the counting unit 23 performs the pass/fail discrimination operation, the fail bit may be calculated from the data read by the seventh read voltage Vr7. As an example, the counting unit 23A counts the number of '0' of the data read by the seventh read voltage Vr7, for example, the number of the memory cells determined as an off-cell, and operate of difference of the number of the counted off-cells with the number of the memory cells in the seventh program state P7, and calculate fail bits.

Figure 9B:
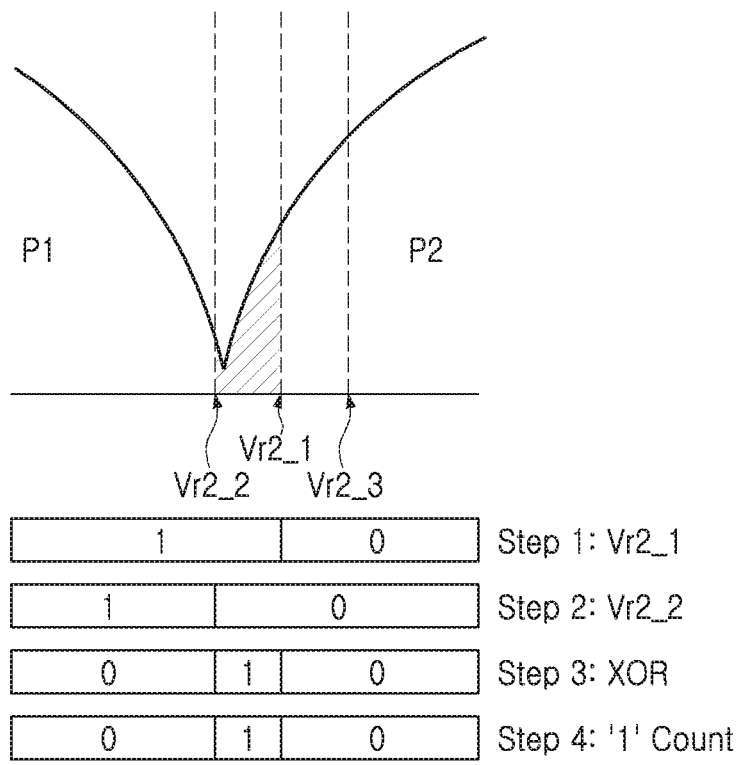
FIG. 9B is a diagram for explaining a read operation of the memory cells according to another example embodiment of the present inventive concepts.

FIG. 9B is a diagram illustrating the read operation of the memory cells according to another example embodiment of the present inventive concepts.

Referring to FIG. 9B, the read operation of the memory cells according to the example embodiments may be performed by providing a plurality of read voltages having different levels to the word lines of the memory cells. The memory controller 10A has the two adjacent state of the memory cells MCEL. For example, the memory controller 10A provides the plurality of read voltages Vr2_1, Vr2_2, Vr2_3 having different levels between the first program state P1 and the second program state P2 to the memory cell MCEL, and then reads the data from the memory cell MCEL. The plurality of read voltages Vr2_1, Vr2_2, and Vr2_3 correspond to the set voltage to identify the first program state P1 and the second program state P2. As an example, the read voltage Vr2_1 may correspond to the read voltage Vr2 in FIGS. 5 and 6, the read voltages Vr2_2, Vr2_3 may correspond to the voltages distributed around the read voltage Vr2_1. The memory device 20A performs a logical operation on the data read from each of two adjacent read voltages among a plurality of read voltage levels, and may count the number of the memory cells MCEL existing in the plurality of sections on the basis of the result of the logical operation. As a result of the counting, the memory controller 10A may detect the read voltage corresponding to the section in which the number of the memory cells among the plurality of sections is smallest, and determine the level of the detected read voltage as the optimum voltage level. Such a read voltage determination operation may be referred to as an On-Chip Valley Search (hereinafter OCVS) operation.

According to the example embodiment, though the number of the plurality of read voltages Vr2_1, Vr2_2, Vr2_3 having different levels is 3, example embodiments of the present inventive concepts is not limited to this, the number of the plurality of voltage levels may be changed variously, a reading direction also may be changed.

In a first step (step 1), the read voltage Vr2_1 is provided to the word line to read data from the memory cell MCEL. Then, the memory cells MCEL whose threshold voltage Vth is lower than the read voltage Vr2_1 are read to '1,' the memory cells MCEL whose threshold voltage Vth is higher than the read voltage Vr2_1 are read to '0.' Like this, the first data read from the first step (step 1) may be stored in the page buffer unit 22. In a second step (step 2), data is read from the memory cell MCEL at the read voltage Vr2_2. Then, the memory cells MCEL whose threshold voltage Vth is lower than the voltage Vr2_2 are read to '1,' and the memory cells MCEL whose threshold voltage Vth is higher than the voltage Vr2_2 are read to '0.' Like this, the second date read in the second step may be stored in the page buffer unit 22. In a third step (step 3), each of the plurality of page buffers included in the page buffer unit 22 performs the logical operation for the first data read by the read voltage Vr2_1 and the second data read by the read voltage Vr2_2. In one example embodiment, each of the plurality of page buffers may perform an exclusive logical sum (XOR) operation on the first data and the second data. In the case the memory cell MCEL whose threshold voltage Vth is lower than the voltage Vr2_2, the result of the exclusive logical sum (XOR) operation of the first and the second data is '0,' and in the case the memory cell MCEL whose threshold voltage is between the voltage Vr2_1 and the voltage Vr2_2, the result of the exclusive logical sum (XOR) operation on the first and the second data is '1,' and in the case of the memory cell MCEL whose threshold voltage Vth is higher than the voltage Vr2_1, the result of the exclusive logical sum (XOR) operation is '0.' Therefore, based on the result of the exclusive logical sum (XOR) operation of the first and second data, it can be determined whether or not the memory cell is included in the section divided by the two adjacent read voltages Vr2_1, Vr2_2. It can be seen that the memory cell is included in the section the result of the exclusive logical sum (XOR) operation is '1,' In a fourth step (step 4), the counting unit 23 may count the number of '1's' in the result of the exclusive logical sum (XOR) operation performed in the page buffer unit 22. Hereby, the counting unit 23 may count the number of memory cells existing in each of the plurality of sections. The memory controller 10A may detect the read voltage corresponding to the section in which the number of the memory cells is the smallest among the plurality of sections, and determine the level of the detected read voltage as the optimum voltage level.

On the other hand, when the counting unit 23 performs the pass/fail discrimination operation, the fail bit may be calculated from the data read by the read voltages Vr2_1, Vr2_2, Vr2_3. As one example, the counting unit 23A may calculate the fail bit from the number of the memory cells existing in each of the plurality of the sections.

Figure 10A:
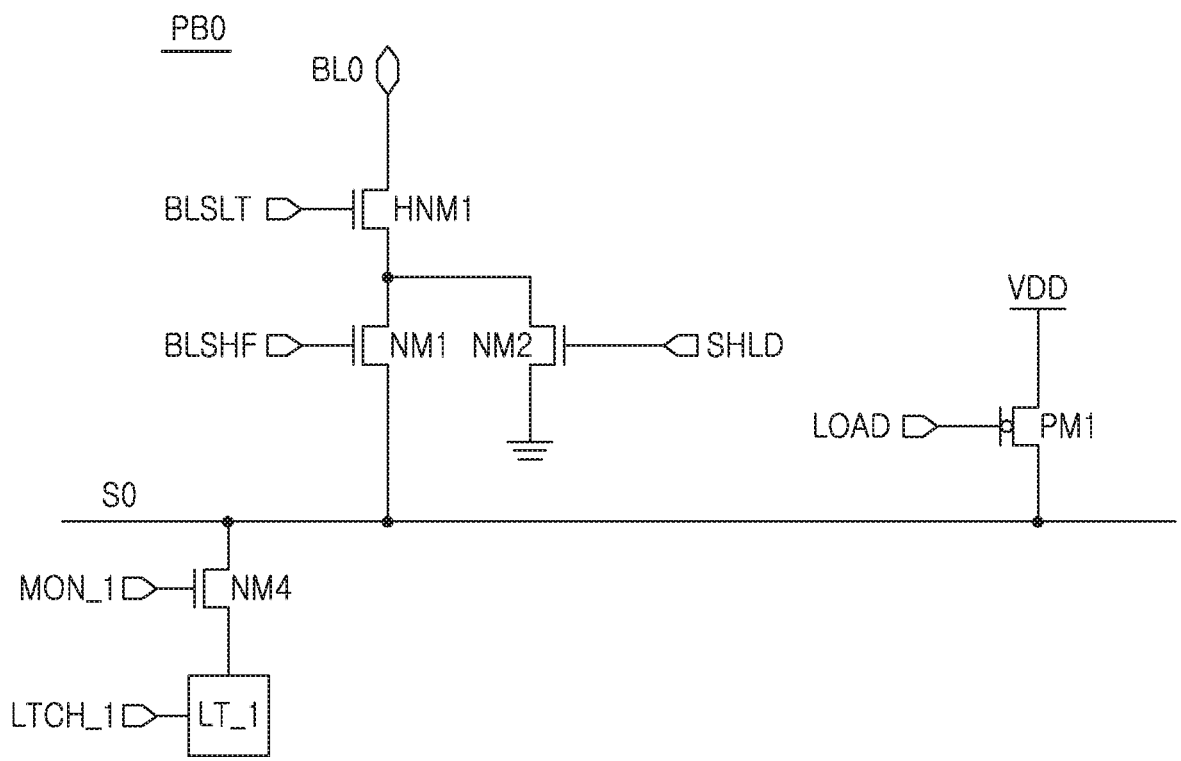
FIG. 10A is a schematic block diagram of a page buffer that may be applied to the example embodiment of FIG. 9B.

FIG. 10A is a schematic block diagram of the page buffer to be applied to the embodiment of FIG. 9B.

Referring to FIG. 10A, the page buffer PB0 connected to the bit line BL0 may be connected to the memory cells of a cell string STR. The page buffer PB0 includes sensing node SO connected to the bit line BL0. The page buffer PB0 may include at least one latch LT_1 connected to each sensing node SO. During the read operation of the memory cells, the bit line BL0 is pre-charged by the control logic 150. As an example, if the load signal LOAD and the control signal BLSHF are activated, the bit line BL0 may be pre-charged to the certain level VBL. At this time, a high voltage transistor HNM1 may be kept turned on by the bit line selection signal BLSLT. Subsequently, if the load signal is inactivated, the charge charged in the sensing node SO flows to the bit line BL0, through the transistor NM1 by the control signal BLSHF. That is, a development operation in which a potential change of the sensing node SO occurs is performed. When the selected memory cell is an on-cell, the charge charged in the sensing node SO can be discharged to the common source line CSL through the bit line BL and the channel of the string. In the case that the selected memory cell is an on cell, the charge charged in the sensing node SO may be discharged to the common source line CSL through the bit line BL and the channel of the string. In this case, since the current flowing from the sensing node SO to the bit line BL is relatively high, the speed of the voltage dip of the sensing node is relatively fast. On the contrary, if the selected memory cell is the off cell, the charge charged in the sensing node SO is hard to discharge to the common source line CSL through the bit line BL0. The latch LT_1 may be provided with a latch control signal LTCH_1 latching the developed state of the sensing node SO. According to the latch control signal LTCH_1, at least one latch LT_1 may latch data regarding the memory cells.

Referring to FIG. 9A, in a case in which the read voltage Vr7 is provided to the word line of the memory cells, the latch control signal LTCH_1 is applied to the latch LT_1, the first latch LT_1 may latch the data according to the application of the read voltage Vr7. Though it is not illustrated in FIG. 10A, the page buffer PB0 may include a switching element (for example, an ENMOS transistor). The switching element may have an output terminal (for example, a source) connecting to a control terminal (for example, a gate) and the counting unit 23A to which the output value of the page buffer is applied. Therefore, if the output value of the page buffer is '1,' the switching element is turned on and may supply a small current to the counting unit 23A, and if the output value of the page buffer is '0,' the switching element is turned off and it may not supply the small current to the counting unit 23A. The counting unit 23A may count on cells or off cells of the memory cells based on the output data from the page buffer unit 22A.

Figure 10B:
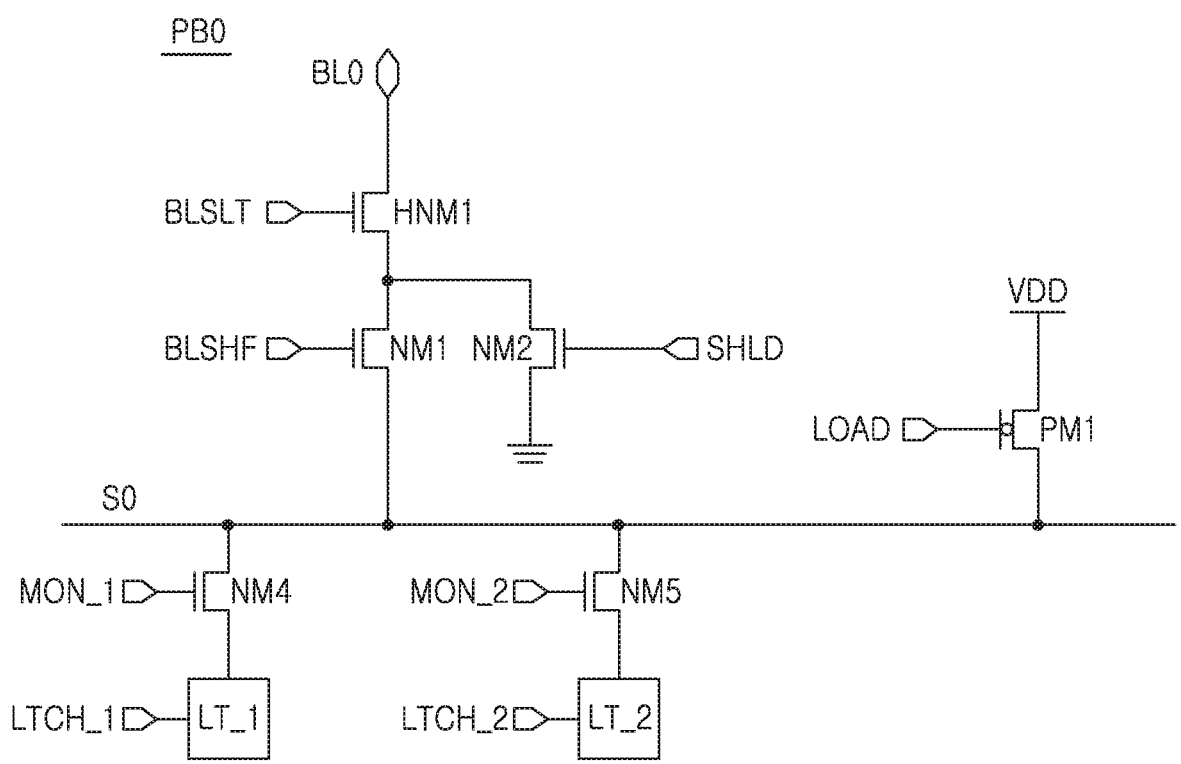
FIG. 10B is a schematic block diagram of a page buffer that may be applied to the example embodiment of FIG. 9B.

FIG. 10B is a schematic block diagram of the page buffer that may be applied to the example embodiment of FIG. 9B. Since the page buffer according to the embodiment of FIG. 10B is similar to the page buffer according to the example embodiment of FIG. 9B, a duplicated description will be omitted and the differences will be mainly described.

Referring to FIG. 10B, the page buffer PB0 connected to the bit line BL0 may be connected to the memory cells of the cell string STR. The page buffer PB0 includes the sensing node SO connected to the bit line BL0. The page buffer PB0 may include a plurality of latches LT_1, LT_2 connected to the sensing node SO respectively. When the read operation of the memory cells, the bit line BL0 may be pre-charged through the control logic 150. As an example, if a load signal and a control signal are activated, the bit line BL0 may be pre-charged to a certain level VBL. At this time, the high voltage transistor HNM1 may be kept turn on by the bit line selection signal BLSLT. Subsequently, if the load signal LOAD is inactivated, the charge charged in the sensing node SO, flows to the bit line BL through the transistor turned on by the control signal BLSHF. That is, the development operation the potential change of the sensing node SO occurs is performed. A plurality of latches LT_1, LT_2 may be provided with the latch control signals LTCH_1, LTCH_2 for latching the developed state of the sensing node SO. The plurality of latches LT_1, LT_2 may latch the data regarding the memory cells according to the latch control signals LTCH_1, LTCH_2. As an example, the latch control signals LTCH_1, LTCH_2 may be provided sequentially. The latches LT_1, LT_2 may perform a plurality of latching operations in consecutive order, for calculating the memory cells existing in the section among the read voltages having different levels.

Referring to FIG. 9B, when the read voltage Vr2_1 is provided to the word line of the memory cells, the latch control signal LTCH_1 is applied to the first latch LT_1, the first latch LT_1 may latch the first data according to the application to the read voltage Vr2_1. Subsequently, when the read voltage Vr2_2 is applied to the second latch LT_2, the second latch LT_2 may latch the second data according to the application to the read voltage Vr2_2. Therefore, the latches LT_1, LT_2 may latch the data according to the plurality of read voltages sequentially.

The page buffer PB0 may perform an exclusive logical sum (XOR) operation data stored in the latches LT_1, LT_2, and calculate the logical results corresponding to the section among the plurality of read voltages. The counting unit 23A may output counting results by counting the number of the memory cells existing in each of the plurality of the sections based on the result of logical operation output in the page buffer unit 23A. The counting unit 23A may count the number of the memory cells existing in the plurality of sections by counting the number of '1's' existing in each of the plurality of sections in the result of the exclusive logical sum (XOR) operation output from the page buffer unit 22A.

On the other hand, assuming that the data stored in the page buffers PB0 to PBd-1 included in one page buffer group are uniformly distributed, the number of the memory cells may be counted by sampling the data stored in a part of the page buffers among the page buffers PB0 to PBd-1 included in one page buffer group. This sample scheme may be suitable for counting the number of multilevel memory cells, such as a quadruple bit level cell QLC, storing more data than a triple bit level cell TLC, or counting fail bits.

Particularly, considering that the page buffers PB0 to PBd-1 are connected to the counting unit through one data output unit, by sampling some of the stored data among the page buffers PB0 to PBd-1 and counting the number of the memory cells, the time required for counting the memory cells may be effectively reduced. However, when remaining page buffers which are not sampled are operated, unnecessary power may be consumed according to the operation of the remaining page buffers.

Figure 11:
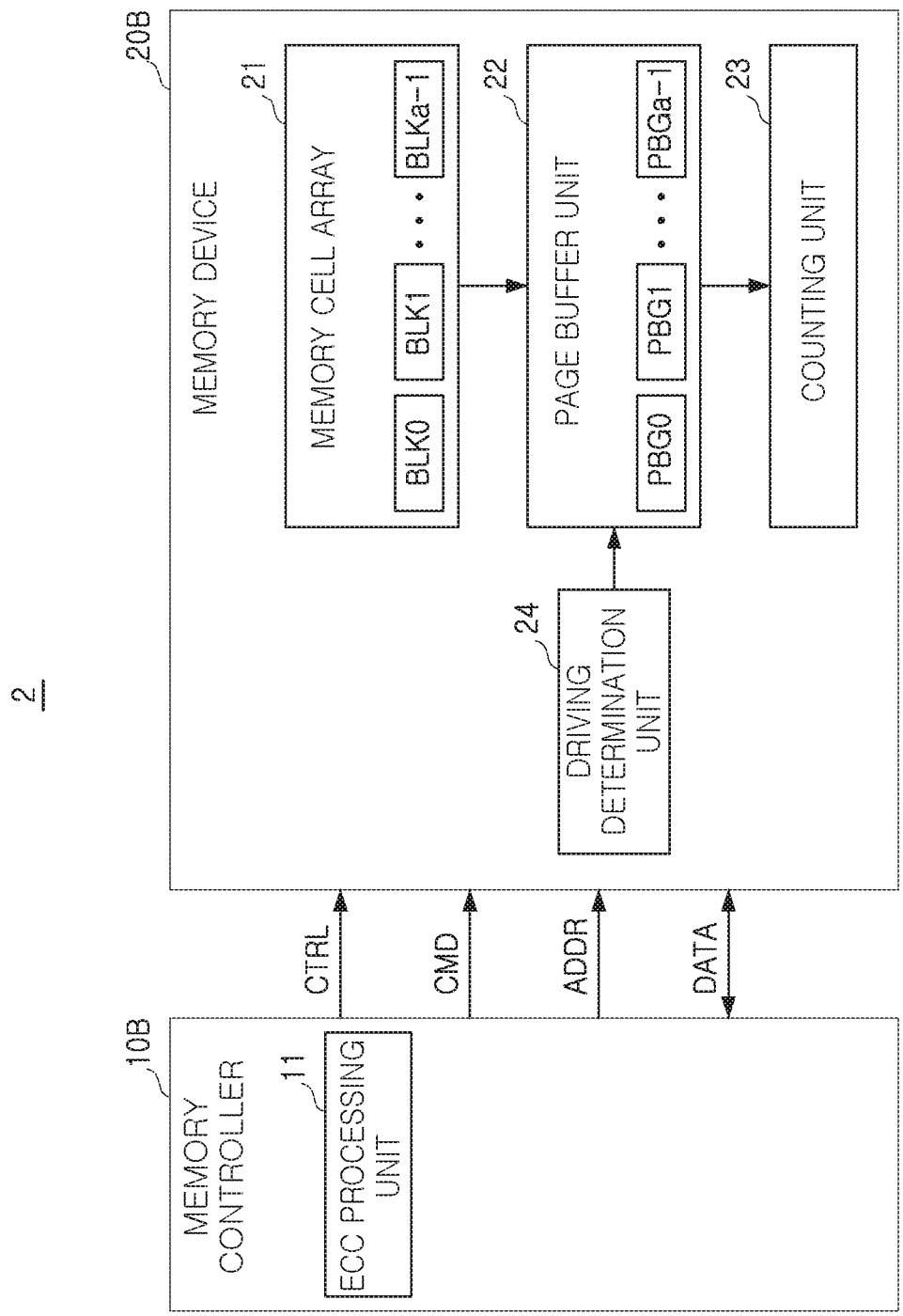
FIG. 11 is a block diagram indicating the memory system according to an example embodiment of the present inventive concepts.

FIG. 11 is a block diagram illustrating a memory system according to an example embodiment of the present inventive concepts.

Referring to FIG. 11, the memory system 2 may include a memory controller 10B and a memory device 20B.

Since the memory system 2 according to the example embodiment of FIG. 11 is similar to the memory system 1 according to the example embodiment of FIG. 1, duplicate descriptions will be omitted, and differences will be mainly described. The memory system 2 according to the example embodiment of FIG. 11 may further include a driving determination unit 24 as compared to the memory system 1 according to the example embodiment of FIG. 11.

The memory device 20B may include processing circuitry (not shown). The processing circuitry may be, but not limited to, a processor, Central Processing Unit (CPU), a controller, an arithmetic logic unit (ALU), a digital signal processor, a microcomputer, a field programmable gate array (FPGA), an Application Specific Integrated Circuit (ASIC), a System-on-Chip (SoC), a programmable logic unit, a microprocessor, or any other device capable of performing operations in a defined manner.

The processing circuitry may be configured, through a layout design or execution of computer readable instructions stored in a memory (not shown), as a special purpose computer to implement the driving determination unit 24 to determine the page buffers to be driven and non-driven among the page buffers of the page buffer groups PBG0 to PBGa-1 included in the page buffer unit 22.

As one example, the driving determination unit 24 is synchronized with the sampling operation determined by the mode, and may determine the page buffers to be driven and to be non-driven. The driving determination unit 24 may control the pre-charging operation, development operation, and the latching operation.

Figure 12:
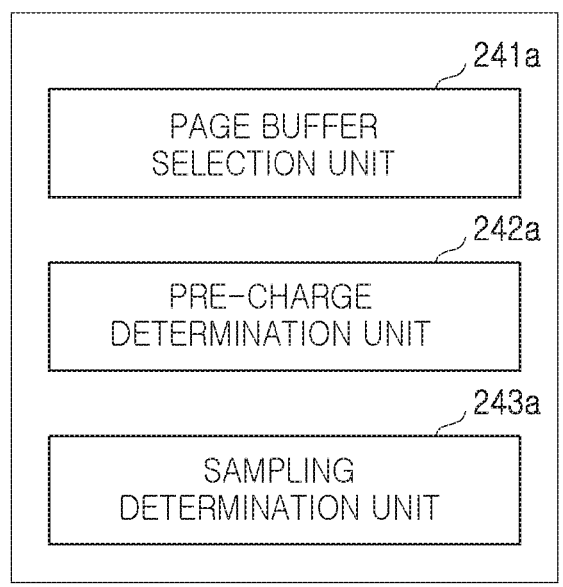
FIG. 12 is a detailed block diagram of a driving determination unit according to an example embodiment of the present inventive concepts.

FIG. 12 is a detailed block diagram of the driving determination unit according to an example embodiment of the present inventive concepts.

Referring to FIG. 12, a driving determination unit 24A according to an example embodiment of the present inventive concepts may include a page buffer selection unit 241a, and a pre-charge determination unit 242a.

As discussed above, the memory device 20B may include processing circuitry. The processing circuitry may be configured, through a layout design or execution of computer readable instructions stored in a memory (not shown), as a special purpose computer to implement the driving determination unit 24A including the page buffer selection unit 241a, and the pre-charge determination unit 242a.

The page buffer selection unit 241a may select some of the page buffers included in the page buffer 22. The page buffer selection unit 241a may select N page buffers (a nature number less than D) among D (an integer more than 1) page buffers PB0, PB1, PB2, PB3, ..., PBd-1 included in the page buffer unit 22.

FIGS. 13 to 16 are diagrams illustrating an example of a page buffer according to an example embodiment of the present inventive concepts.

Figures 13, 14:
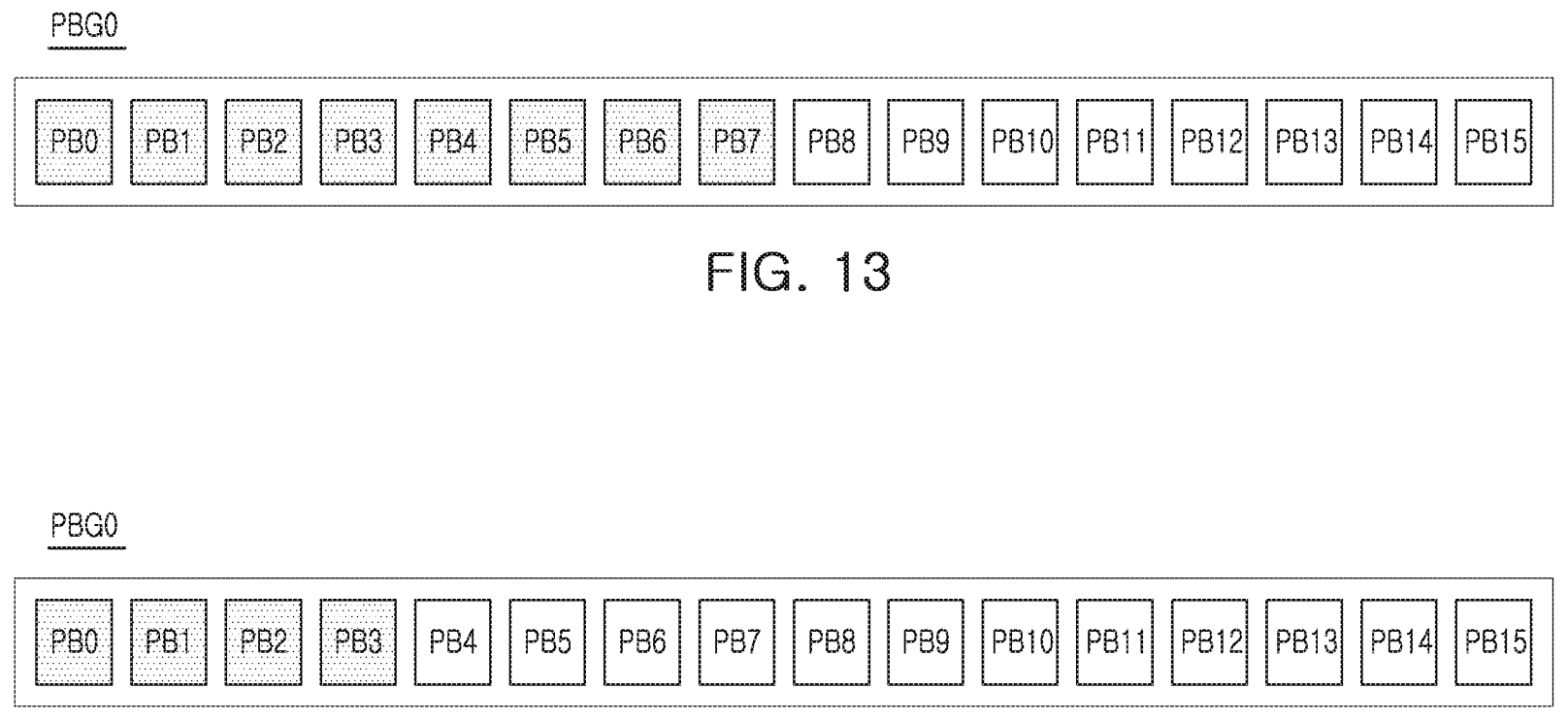
Figures 15, 16:
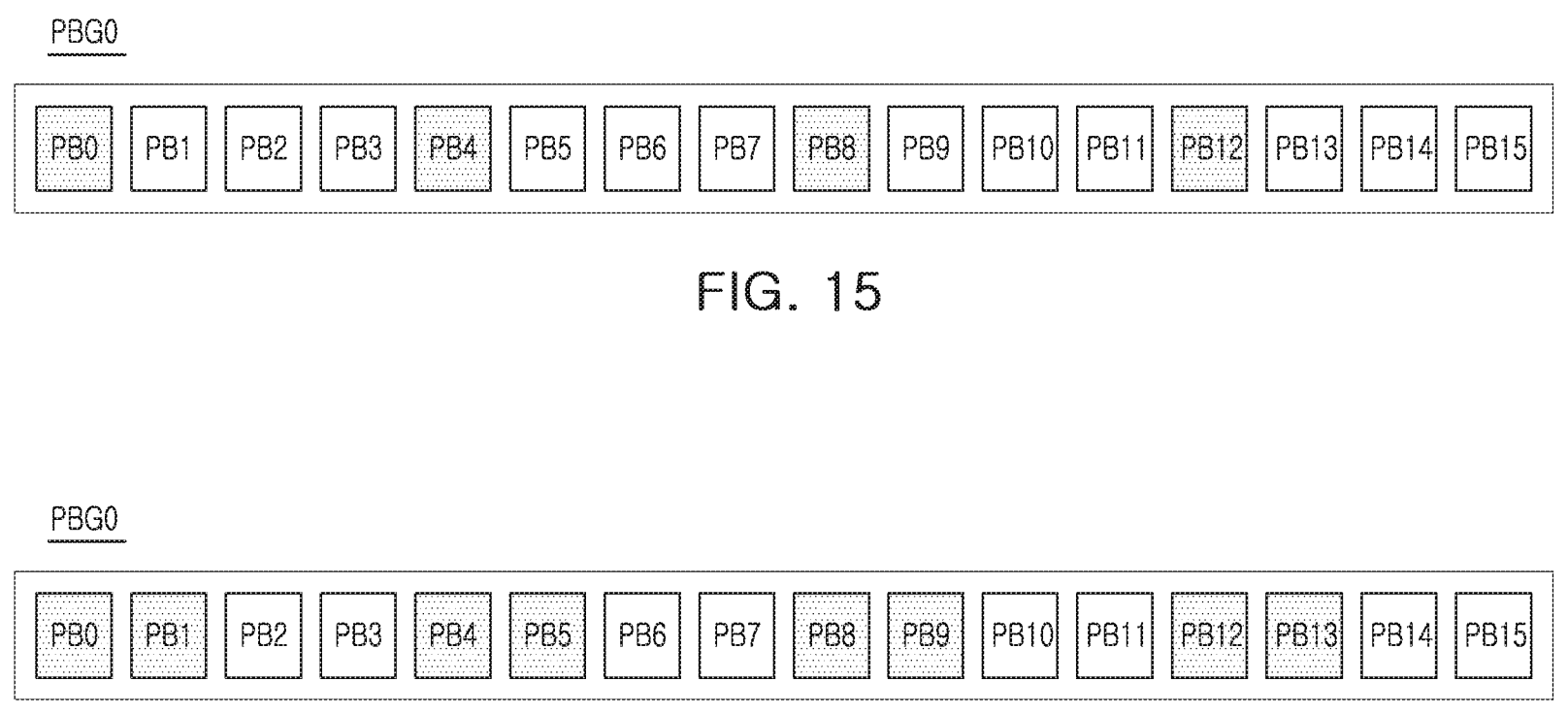

Referring to FIGS. 13 and 16, the page buffer unit 22 may include 16 page buffers PB0, PB1, PB2, PB3, ..., PB15, the page buffer selection unit 241a may select N (a is a natural number less than 15) page buffers among 16 page buffers PB0, PB1, PB2, PB3, ..., PB15.

Referring to FIG. 13, the page buffer unit 22 may select 8 page buffers PB0, PB1, PB2, PB3, ..., PB8, connected to consecutively arranged bit lines among 16 page buffers PB0, PB1, PB2, PB3, ..., PB15, and referring to FIG. 14, the page buffer unit 22 may select 4 page buffers PB0, PB1, PB2, PB3, connected to consecutively arranged bit lines among 16 page buffers PB1, PB1, PB2, PB3, ..., PB15. In addition, referring to FIG. 15, the page buffer unit 22 may select 4 page buffers PB0, PB4, PB8, PB12, connected to consecutively arranged to be spaced apart by a desired (or, alternatively, a predetermined) interval among 16 page buffers PB0, PB1, PB2, PB3, ..., PB15. In addition, the page buffer unit 22 may select a total of 8 page buffers PB0, PB1, PB5, PB6, PB9, PB10, PB13, PB14, by selecting 2 page buffers connected to bit lines, which are arranged to be space apart by the desired (or, alternatively, the predetermined) interval. FIGS. 13 and 16 is a mere example indicating the selected page buffers, and the method of selecting the page buffers may be variously applied.

Again, referring to FIG. 12, the pre-charge determination unit 242a may determine pre-charging operation charging the bit lines connected to the page buffers. The pre-charge determination unit 242a may pre-charge the bit lines connected to the N page buffers selected by the page buffer selecting unit 241a, and terminate the pre-charging of the bit lines connected to the remaining d-N page buffers. Therefore, the power consumption of the memory core may be reduced from the pre-charge termination.

The sampling determination unit 243a may sample the data stored in the page buffers to provide the data to the counting unit 23. As an example, the sampling operation may be performed through the data output unit connected to a plurality of page buffers. The sampling determination unit 243a may sample the data stored in N page buffers selected in the page buffer selection unit 241A and provide the sampled data to the counting unit 23.

The counting unit 23 may count the read or logical operation results stored in the selected N page buffers.

Figure 17:
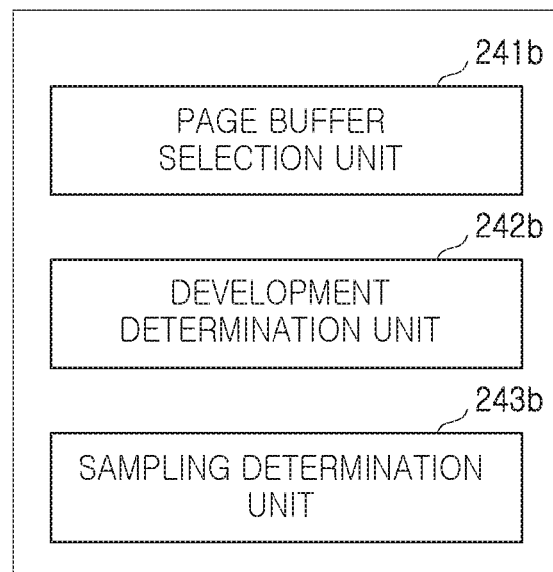
FIG. 17 is a detailed block diagram of a driving determination unit according to another example embodiment of the present inventive concepts.

FIG. 17 is a detailed block diagram of the driving determination unit according to another example embodiment of the present inventive concepts.

A driving determination unit 24B according to an example embodiment of FIG. 17 is similar to the driving determination unit 24A according to the example embodiment of FIG. 14, so that a duplicated description will be omitted and the differences between them mainly will be described.

Referring to FIG. 17, the driving determination unit 24B may include a development determination unit 242b.

As discussed above, the memory device 20B may include processing circuitry. The processing circuitry may be configured, through a layout design or execution of computer readable instructions stored in a memory (not shown), as a special purpose computer to implement the driving determination unit 24B including the development determination unit 242b.

The development determination unit 242b may determine the development operation in which a potential change occurs in the sensing node SO. The development determination unit 242b develops the sensing node SO of N page buffers selected in the page buffer selection unit 241b, and the development of the sensing node SO of the remaining d-N page buffers may be terminated. Therefore, power consumption of the memory core may be reduced from the termination of the development operation.

Figure 18:
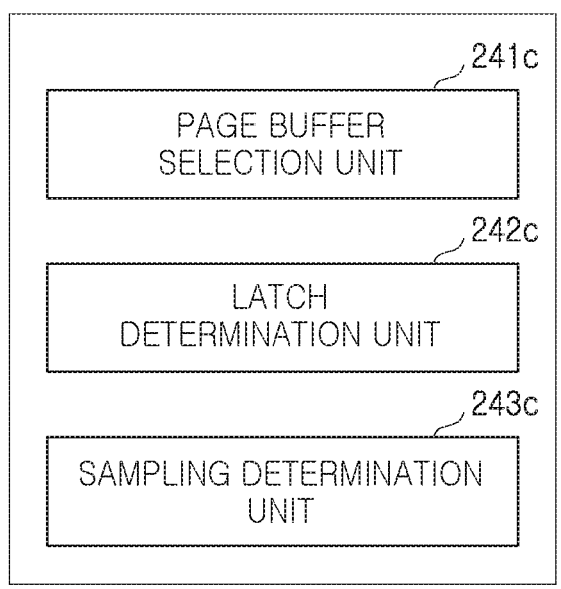
FIG. 18 is a detailed block diagram of a driving determination unit according to the other example embodiment of the present inventive concepts.

FIG. 18 is a detailed block diagram of the driving determination unit of another example embodiment of the present inventive concepts.

Since a driving determination unit 24C according to an embodiment of FIG. 18 is similar to the driving determination unit 24A according to the example embodiment, the duplicate description will be omitted, and the differences will mainly be described.

Referring to FIG. 18, the driving determination unit 23C may include the latch determination unit 242c.

As discussed above, the memory device 20B may include processing circuitry. The processing circuitry may be configured, through a layout design or execution of computer readable instructions stored in a memory (not shown), as a special purpose computer to implement the driving determination unit 24C including the latch determination unit 242c.

The latch determination unit 242c may determine whether to provide the latch signal to the latches of each of the page buffers. The latch determination unit 242a may provide the latch signal for latching the data regarding the memory cells to the latches included in each of the selected N page buffers in the buffer selection unit 241c, and terminate providing the latch signal to the latches included in each of remaining d-N page buffers. Therefore, the power consumption of the memory core may be reduced, from the termination of the latching operation.

Figure 19:
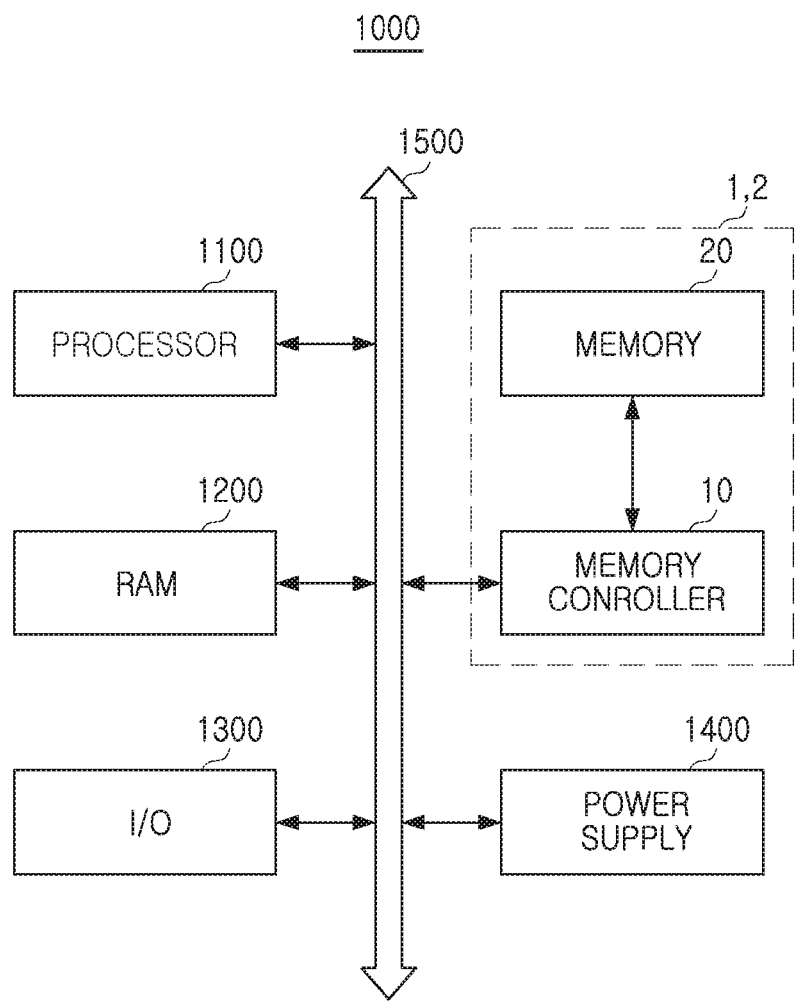
FIG. 19 is a block diagram indicating a computing system according to an example embodiment of the present inventive concepts.

FIG. 19 is a block diagram illustrating a computing system according to an example embodiment of the inventive concepts.

Referring to FIG. 19, a computing system 1000 may include a processor 1100, a RAM 1200, an input/output device 1300, a power supply device 1400 and the memory system 1. Meanwhile, while it is not illustrated in FIG. 19, the computing system 1000 may communicate with video cards, sound cards, memory cards, USB devices, or further include ports capable of communicating with other electronic devices. The computing system 1000 may be implemented as a personal computer or a portable electronic device such as a notebook computer, a mobile phone, a personal digital assistant PDA and a camera. A processor 1100 may perform certain calculations or tasks. According to the example embodiment, the processor 1100 may be micro-processor, central processing unit: CPU. The processor 1100 may perform communications with a RAM 1200, an input/output device 1300 and a memory system 1 through the buses 1500 such as an address bus, a control bus and a data bus. According to the example embodiment, the processor 1100 may be connected to an expansion bus such as a Peripheral Component Interconnect; PCI.

The RAM 1200 may store the data needed for the operation of the computing system 1000. For example, the RAM 1200 may be implemented as a DRAM, a mobile DRAM, a SRAM, a PRAM, A FRAM, A RRAM and/or a MRAM.

The input/output device 1300 may include the input means such as a keyboard, keypad, mouse and the output means such as a printer, a display.

The power device 1400 may supply the operation voltage needed for the operation of the computing system 1000.

Although not disclosed, the memory system 1 according to the present example embodiment may be provided to the storing device of the information processing device capable of exchanging a large amount of data in combination with an application chipset, a camera image processor, and a mobile DRAM.

The memory devices 20A and 20B and the memory systems 1 and 2 according to example embodiments of the present inventive concepts may be implemented by using various types of packages. For instance, the memory devices 20A and 20B and the memory systems 1 and 2 may be implemented by using packages such as Package on Package (PoP), Ball grid arrays (BGAs), Chip scale packages (CSP), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline TSOP, Thin Quad Flatpack (TQFP), System In Package (SIP), Multi Chip Package (MCP), Wafer-level Fabricated Package (WFP), Wafer-Level Processed Stack Package (WSP).

According to one or more example embodiments, the units and/or devices described above including elements of the memory devices 20A, 20B such as, for example the counting unit 23 and the driving determination unit 24 and sub-elements thereof, may be implemented using hardware, a combination of hardware and software, or a non-transitory storage medium storing software that is executable to perform the functions of the same.

Hardware may be implemented using processing circuitry such as, but not limited to, one or more processors, one or more Central Processing Units (CPUs), one or more controllers, one or more arithmetic logic units (ALUs), one or more digital signal processors (DSPs), one or more microcomputers, one or more field programmable gate arrays (FPGAs), one or more System-on-Chips (SoCs), one or more programmable logic units (PLUs), one or more microprocessors, one or more Application Specific Integrated Circuits (ASICs), or any other device or devices capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, etc., capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., one or more processors, CPUs, controllers, ALUs, DSPs, microcomputers, microprocessors, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor. In another example, the hardware device may be an integrated circuit customized into special purpose processing circuitry (e.g., an ASIC).

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Software and/or data may be embodied permanently or temporarily in any type of storage media including, but not limited to, any machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including tangible or non-transitory computer-readable storage media as discussed herein.

Storage media may also include one or more storage devices at units and/or devices according to one or more example embodiments. The one or more storage devices may be tangible or non-transitory computer-readable storage media, such as random access memory (RAM), read only memory (ROM), a permanent mass storage device (such as a disk drive), and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the storage media, the computer programs, program code, instructions, or some combination thereof, may be specially designed and constructed for the purposes of the example embodiments, or they may be known devices that are altered and/or modified for the purposes of example embodiments.

While example embodiments of the present inventive concepts is described with reference to example embodiments illustrated in FIGS., it is merely a sample, it will be understood that various modifications and equivalent example embodiments may be made by those skilled in the art in the present technical field. Accordingly, a true scope of the protection should be determined by the attached claims.

As set forth above, according to example embodiments of the present inventive concepts, in synchronization with sampling operations of data stored in portions of page buffers, remaining page buffers may not be non-actuated, thereby reducing power consumption in the page buffers, and shortening a read time.

While example embodiments have been shown and described above, it will be apparent to those skilled in the art that modifications and variations could be made without departing from the scope of the example embodiments of the present inventive concepts as defined by the appended claims.

What is claimed is:

1. A memory device, including:
a memory cell array including a plurality of memory cells;
a plurality of page buffers configured to store data associated with memory cells of the plurality of memory cells that are provided with a read voltage; and
processing circuitry configured to,
select some of the plurality of page buffers as selected page buffers such that remaining ones of the plurality of page buffers are non-selected page buffers such that at least one of the plurality of page buffers are the non-selected page buffers,
perform at least one of a pre-charging operation, a development operation, and a latching operation of the selected page buffers connected to the memory cells provided with the read voltage such that such that the non-selected page buffers are non-actuated in synchronization with the at least one of the pre-charging operation, the development operation, and the latching operation of the selected page buffers.

2. The memory device of claim 1, wherein the processing circuitry is configured to select some of the plurality of the page buffers such that bit lines connected to the selected page buffers are arranged consecutively.

3. The memory device of claim 1, wherein the processing circuitry is configured to select some of the plurality of the page buffers such that bit lines connected to the selected page buffers are spaced apart from each other by an interval.

4. The memory device of claim 1, wherein the processing circuitry is configured to select some of the plurality of the page buffers such that the processing circuitry is configured to pre-charge bit lines connected to the selected page buffers, and to terminate pre-charging of bit lines connected to the non-selected page buffers.

5. The memory device of claim 1, wherein the processing circuitry is configured to develop sensing nodes associated with the selected page buffers, and to terminate development of sensing nodes associated with the non-selected page buffers.

6. The memory device of claim 1, wherein the processing circuitry is configured to provide a latch control signal to latches associated with the selected page buffers, and to terminate providing the latch control signal to latches of the non-selected page buffers.

7. The memory device of claim 1, wherein the processing circuitry is configured to sample the data stored in the selected page buffers.

8. A memory device, comprising;
a plurality of page buffers configured to store data associated with memory cells among a plurality of memory cells provided with a read voltage, and output the data stored in the plurality of page buffers; and
processing circuitry configured to, count at least one of on-cells and off-cells of the memory cells based on the data output from ones of the plurality of page buffers for calculating fail bit value, determine which of the plurality of page buffers are selected page buffers, and drive the selected page buffers.

9. The memory device of claim 8, wherein the plurality of page buffers are configured to sequentially outputs data stored therein.

10. The memory device of claim 9, wherein the processing circuitry is configured to count the data output from the selected page buffers.

11. The memory device of claim 9, wherein the selected page buffers are configured to perform one or more of a pre-charging operation, a development operation and a latching operation.

12. The memory device of claim 11, wherein non-selected page buffers of the plurality of the page buffers are configured to terminate performing at least one of the pre-charging operation, the development operation and the latching operation.

13. A memory device comprising;
a memory cell array including a plurality of memory cells; and
a plurality of pages buffers configured to store data associated with memory cells among the plurality of memory cells provided with a read voltage, and to sample the data stored in selected page buffers among the plurality of page buffers such that non-selected page buffers among the plurality of page buffers including at least one of the plurality of page buffers are non-actuated in synchronization with sampling of the data.

14. The memory device of claim 13, wherein the memory device is configured to terminate a pre-charging operation of bit lines connected to the non-selected page buffers.

15. The memory device of claim 13, wherein the memory device is configured to terminate a development operation of sensing nodes associated with the non-selected page buffers.

16. The memory device of claim 13, wherein the memory device is configured to terminate a latching operation of latches provided in the non-selected page buffers.

17. The memory device of claim 13, wherein the memory device is configured to sequentially sample the selected page buffers.

18. The memory device of claim 13, further comprising:
processing circuitry configured to count at least one of on-cells and off-cells of the memory cells based on the data that is output from the selected page buffers.

19. The memory device of claim 18, wherein the processing circuitry is configured to calculate a bit fail value by counting at least one of the on-cells or off-cells.

* * * * *